US010102959B2

(12) United States Patent
Lee et al.

(10) Patent No.: US 10,102,959 B2
(45) Date of Patent: Oct. 16, 2018

(54) MAGNETIC SHEET AND COMMON MODE FILTER INCLUDING THE SAME

(71) Applicant: Samsung Electro-Mechanics Co., Ltd., Suwon-si (KR)

(72) Inventors: Kwang-Jik Lee, Seongnam-si (KR); Yu-Lim Choi, Sejong (KR); Myung-Jae Yoo, Ulsan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 88 days.

(21) Appl. No.: 15/343,560

(22) Filed: Nov. 4, 2016

(65) Prior Publication Data

US 2017/0133144 A1 May 11, 2017

(30) Foreign Application Priority Data

Nov. 9, 2015 (KR) ........................ 10-2015-0156779

(51) Int. Cl.

| | |
|---|---|
| ***H01F 27/24*** | (2006.01) |
| ***H01F 5/00*** | (2006.01) |
| ***H01F 27/255*** | (2006.01) |
| ***H01F 1/36*** | (2006.01) |
| ***H01F 27/29*** | (2006.01) |
| ***H01F 27/32*** | (2006.01) |
| ***H01F 1/37*** | (2006.01) |
| ***H01F 17/00*** | (2006.01) |
| ***H01F 17/04*** | (2006.01) |

(52) U.S. Cl.
CPC ............. *H01F 27/255* (2013.01); *H01F 1/36* (2013.01); *H01F 1/37* (2013.01); *H01F 17/0013* (2013.01); *H01F 17/04* (2013.01); *H01F 27/292* (2013.01); *H01F 27/324* (2013.01); *H05K 999/99* (2013.01)

(58) Field of Classification Search
CPC .... H01F 27/255; H01F 27/324; H01F 27/292; H01F 27/2804; H01F 27/245; H01F 1/36; H01F 3/08; H01F 3/10
USPC ......................................... 336/200, 223, 233
See application file for complete search history.

(56) References Cited

U.S. PATENT DOCUMENTS

| | | | | |
|---|---|---|---|---|
| 2013/0113593 A1* | 5/2013 | Jeong | H01F 17/0013 | 336/200 |
| 2013/0293334 A1* | 11/2013 | Shin | H01F 1/26 | 336/192 |
| 2014/0266543 A1* | 9/2014 | Park | H01F 17/0013 | 336/200 |
| 2014/0285303 A1* | 9/2014 | Cho | H01F 17/0013 | 336/192 |
| 2016/0049234 A1* | 2/2016 | Kawashima | H01F 17/0013 | 336/200 |

* cited by examiner

*Primary Examiner* — Mangtin Lian
(74) *Attorney, Agent, or Firm* — NSIP Law

(57) ABSTRACT

A common mode filter includes: an insulator; a coil pattern embedded within in the insulator; and a magnetic layer including a layer of material filled with different-size magnetic particles, wherein a surface of the magnetic layer is adhered to the insulator.

9 Claims, 2 Drawing Sheets

MAGNETIC SHEET AND COMMON MODE FILTER INCLUDING THE SAME

CROSS-REFERENCE TO RELATED APPLICATIONS

This application claims the benefit under 35 USC 119(a) of Korean Patent Application No. 10-2015-0156779, filed on Nov. 9, 2015, in the Korean Intellectual Property Office, the entire disclosure of which is incorporated herein by reference for all purposes.

BACKGROUND

1. Field

The following description relates to a magnetic sheet and a common mode filter including such a magnetic sheet.

2. Description of Related Art

Most electronic devices generate noise. If the noise is introduced into an internal circuit of the electronic device, the circuit may be damaged, or a signal generated by the electronic device may be distorted. In order to prevent the damage in the circuit of the electronic device or the distortion of the signal, a filter may be installed to prevent an abnormal voltage or a high frequency noise from entering the circuit. For example, a common mode filter is generally used to remove a common mode noise in a high speed differential signal line.

As electronic devices become increasingly smaller and high-performing, the common mode filter needs to have a higher inductance for a given size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a common mode filter includes: an insulator; a coil pattern embedded within the insulator; and a magnetic layer including a layer of material filled with different-size magnetic particles, wherein a surface of the magnetic layer is adhered to the insulator.

Particles having different sizes, among the different-size magnetic particles, may be disposed in a region toward the surface of the magnetic layer adhered to the insulator. Magnetic particles having similar sizes, among the different-size magnetic particles, may be disposed in a region toward another surface of the magnetic layer opposite the surface of the magnetic layer adhered to the insulator.

The layer of material may include a sheet made of a resin material. The different-size magnetic particles may include spherical ferrite particles.

An amount of the spherical ferrite particles in the magnetic layer may be 93 wt %.

The magnetic layer may include magnetic layers laminated on a top surface of the insulator and a bottom surface of the insulator.

The common mode filter may further include a passivation layer disposed between the magnetic layer and the insulator.

The common mode filter may further include electrodes formed on lateral surfaces of the insulator and the magnetic layer, and connected to the coil pattern.

The magnetic layer may be laminated on the insulator.

In another general aspect, a magnetic sheet includes: a resin formed in a layer structure; and different-size magnetic particles filled in the resin.

Magnetic particles having different sizes, among the different-size magnetic particles, may be disposed in a region toward a first surface of the magnetic sheet. Magnetic particles having similar sizes, among the different-size magnetic particles, may be disposed in a region toward a second surface of the magnetic sheet opposite the first surface.

The different-size magnetic particles may include spherical ferrite particles.

An amount of the spherical ferrite particles in the magnetic sheet may be 93 wt %.

In another general aspect, a common mode filter includes: an insulating layer; a coil pattern disposed in the insulating layer; and a magnetic layer adhered to the insulating layer and including magnetic particles disposed in a resin, wherein particles of different sizes, among the magnetic particles, are disposed in a region of a first surface of the magnetic layer contacting the insulating layer, and wherein only particles of a similar size, among the magnetic particles, are disposed in a region of a second surface of the magnetic layer opposite the first surface.

The magnetic particles may include spherical ferrite particles in an amount of 93 wt % of the magnetic layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
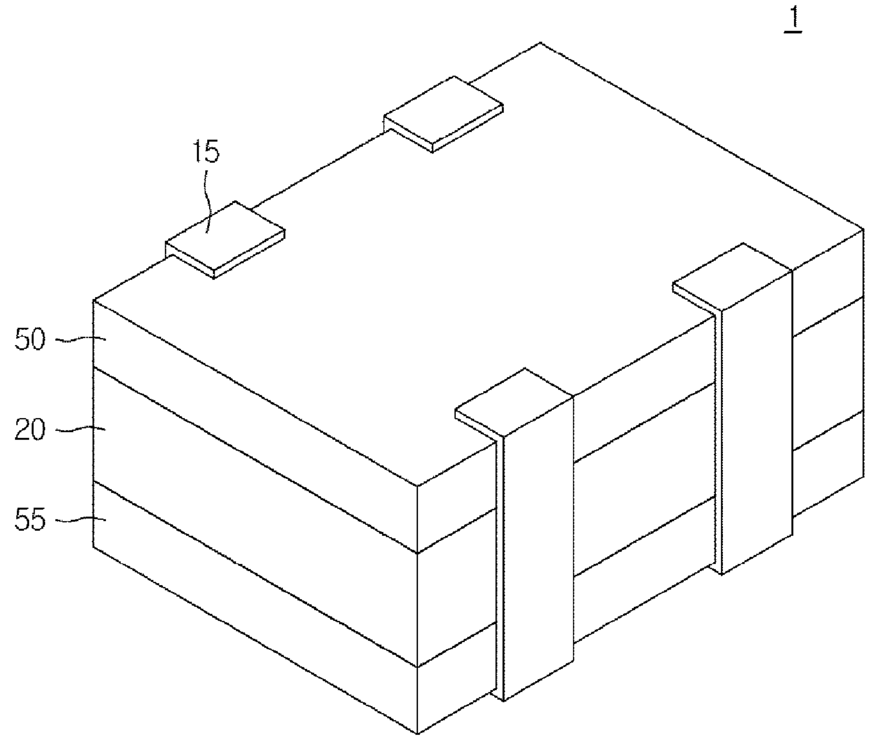
FIG. 1 is a perspective view illustrating an example of a common mode filter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
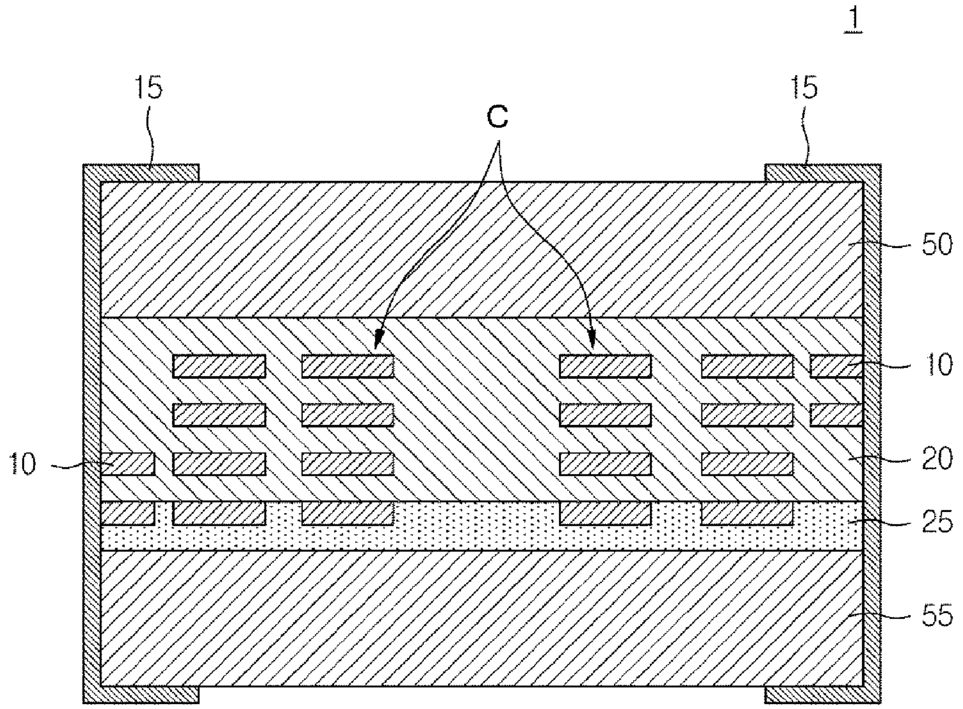
FIG. 2 is a cross-sectional view illustrating an example of a common mode filter.

FIG. 1 and FIG. 2 illustrate an example of a common mode filter 1. Referring to FIG. 1 and FIG. 2, the common mode filter 1 includes a coil pattern 10, an insulator 20 and magnetic layers 50, 55.

The coil pattern 10 functions as an inductor. The coil pattern 10 may be formed in a spiral shape. The coil pattern 10 has an elongated pattern length, and therefore has an increased inductance. The spiral-shaped coil pattern 10 may be formed in a multiple layer structure connected through vias. Referring to FIG. 2, the coil pattern 10 has a four-layer structure in which a first layer and a third layer are connected to each other through a via, and a second layer and a fourth layer are connected to each other through a via, thereby forming an extended spiral coil.

The coil pattern 10 may include a pair of coil patterns. Magnetic attraction is formed between the pair of coil patterns 10. An inductance effect of a common mode noise is increased by the magnetic attraction.

The coil pattern 10 may be made of a material having an excellent conductivity and machinability, such as copper (Cu) or aluminum (Al). The coil pattern 10 may be formed using various methods, including photolithography and plating.

The common mode filter 1 includes electrodes 15 connected to the coil pattern 10. As illustrated in FIG. 1 and FIG. 2, the electrodes 15 may be formed on lateral surfaces of the insulator 20 and magnetic layers 50, 55. Each end of the coil C formed of the coil pattern 10 is connected to a respective one of the outside electrodes 15 through, for example, a lead-out line. As illustrated in FIG. 1, a total of four electrodes 15 may be formed on lateral surfaces of the insulator 20 and the magnetic layers 50, 55, with two terminals being disposed on each lateral surface.

The coil pattern 10 is embedded in the insulator 20. For example, the insulator 20 is a an insulation sheet or layer made of a polymer resin, such as epoxy resin or polyimide resin, which has an excellent insulating property and good machinability. Referring to FIG. 2, the multiple layers of the coil pattern 10 are separated from one another by the insulator 20, thus preventing a short circuit between the layers.

The common mode filter 1 includes a passivation layer 25 that is in contact with the insulator 20 and the magnetic layer 55. The passivation layer 25 is disposed between the magnetic layer 55 and the insulator 20. The passivation layer 25 may be made of any of various resin materials that promote the adhesion of the magnetic layer 55 to the passivation layer 25. Moreover, the passivation layer 25 may include any of various composite materials that provide improved inductance of the common mode filter 1. A portion of the coil pattern 10 is embedded in the passivation layer 25.

The magnetic layer 50 and the magnetic layer 55 are respectively disposed on a top surface of the insulator 20 and a bottom surface of the insulator 20, and form a closed magnetic circuit within the common mode filter 1 to enhance an inductance of the coil C. The magnetic layers 50, 55 each include a sheet of material such as a resin, and magnetic particles 52 filled in the sheet of material to facilitate flux flow. Thus, the magnetic layers 55 have high magnetic permeability. The magnetic layer 50 may be laminated on the top surface of the insulator 20, and the magnetic layer 55 may be laminated on a bottom surface of the passivation layer 25 to thereby be indirectly disposed on the bottom surface of the insulator 20. Multiple magnetic layers 50, 55 may be provided. The magnetic layers 50, 55 may form a closed magnetic circuit without including a magnetic substrate, such as a ferrite substrate, in the common mode filter 1.

Figure 3:
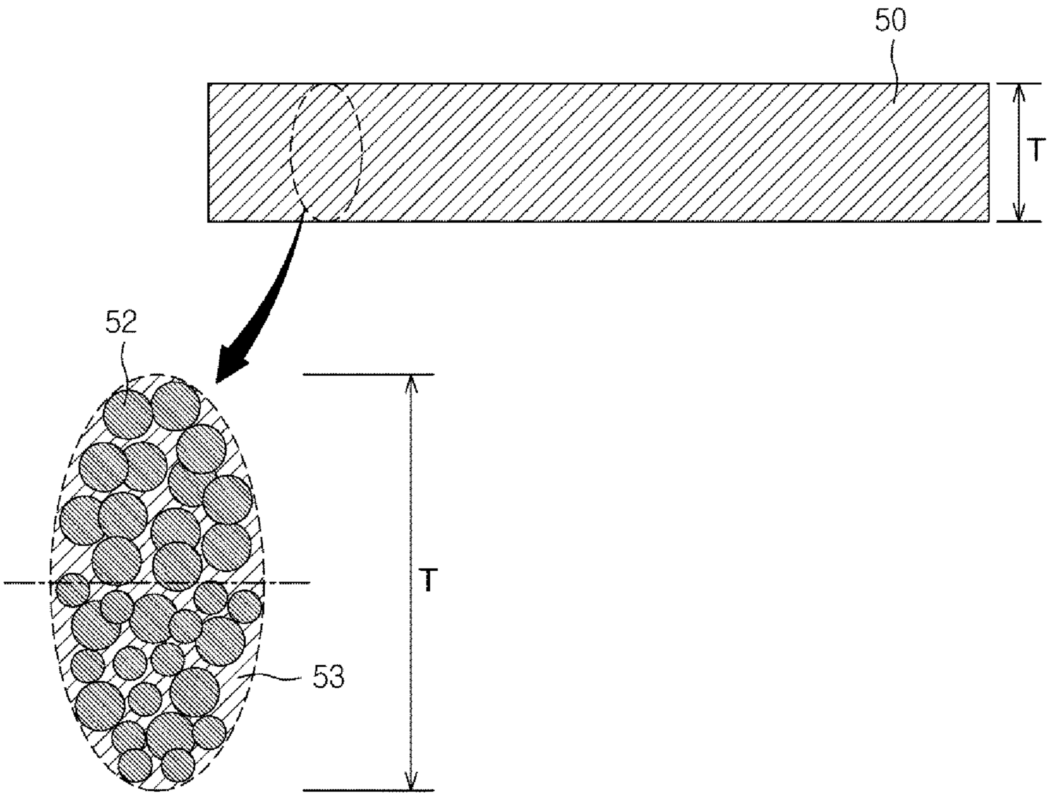
FIG. 3 illustrates an example of a magnetic layer of a common mode filter.

FIG. 3 illustrates the magnetic layer 50 in greater detail. Referring to FIG. 3, in order to enhance the adhesion with the insulator 20, the magnetic layer 50 is filled with two or more kinds of magnetic particles 52. That is, the magnetic particles 52 have two or more different particle sizes. The particles 52 are filled in a layer structure of resin 53 to form a magnetic sheet, and then, as shown in FIG. 2, the magnetic sheet is laminated on the insulator 20 to form the magnetic layer 50.

As illustrated in FIG. 3, particles having two or more different sizes, among the magnetic particles 52, are arranged in a region toward a surface of the magnetic sheet, and particles having the same or similar sizes, among the magnetic particles 52, are arranged in a region toward another surface of the magnetic sheet. That is, particles having two or more different sizes, among the magnetic particles 52, are disposed in a region from a surface of the magnetic layer 50 to a centerline of a thickness T of the magnetic layer 50, and particles having similar or the same sizes, among the magnetic particles 52, are disposed in a region from another, opposite surface of the magnetic layer 50 to the centerline of the thickness T. Increasing the content of magnetic particles in the sheet in order to increase the magnetic permeability may deteriorate the adhesiveness. Accordingly, by mixing the different-size magnetic particles 52 in the magnetic sheet, a decrease in adhesiveness can be minimized. In the example shown in FIG. 3, a proper adhesiveness may be provided on the surface of the magnetic sheet to be in contact with the insulator 20 by arranging the particles having different sizes, among the magnetic particles 52, in the region toward the surface of the magnetic sheet to be in contact with the insulator 20. Then, a high magnetic permeability may be provided by arranging the particles having the same or similar sizes, among the magnetic particles 52, toward the other surface of the magnetic sheet opposite the surface of the magnetic sheet to be in contact with the insulator 20.

The magnetic layer 55 may have a structure and composition that is similar to the structure and composition of the magnetic layer 50 described above and shown in FIG. 3. However, the magnetic sheet forming the magnetic layer 55 is laminated on the passivation layer 25, and is therefore indirectly laminated on/adhered to the insulator 20. Further, to promote improved adhesion of the magnetic layer 55 to the passivation layer 25, the particles having two or more different sizes, among the magnetic particles 52, are disposed in a region toward the surface of the magnetic layer 55 that contacts the passivation layer 25. Accordingly, the particles having the same or similar sizes, among the magnetic particles 52, are disposed in a region toward the opposite surface of the magnetic layer 55.

For example, spherical ferrite filler particles are used for the magnetic particles 52, and the magnetic permeability is increased by providing the ferrite filler particles in an amount of 93 wt % of the magnetic layer 50/55. Moreover, by mixing two different sizes of ferrite filler particles in the region near and on the surface of the magnetic layer 50/55 that is to be in contact with the insulator 20, sufficient adhesiveness can be provided while maintaining a high magnetic permeability. The relationship between magnetic permeability and adhesiveness of a magnetic sheet, based on the content and size variation of ferrite filler particles, is shown below in Table 1. The peel strength in Table 1 was measured by attaching the magnetic sheet to a copper foil having a thickness of 35 μm.

TABLE 1

Magnetic Permeability and Peel Strength based on Variation of Ferrite Filler Content and Size

| | 90 wt % Same-size particles | 93 wt % Same-size particles | 93 wt % Different-size particles | 93 wt % Same-size particles (Non-contact surface) and Different-size particles (Contact surface) |
|---|---|---|---|---|
| Magnetic Permeability (H/m) | 17.7 | 23.9 | 21.1 | 22.3 |
| Peel Strength (kgf/cm) | 1.25 | 0.38 | 1.02 | 0.95 |

As shown in Table 1, increasing magnetic permeability by increasing the content of single-size ferrite filler particles lowers adhesiveness substantially. On the contrary, by increasing the content of different-size ferrite filler particles, it is possible to prevent a loss of adhesiveness, although magnetic permeability decreases slightly. Particularly, as in this example, by arranging different-size particles at a region of contact surface of the magnetic sheet and arranging same-or-similar-size particles at a region of non-contact surface of the magnetic sheet, it is possible to minimize deterioration of adhesiveness while maintaining a high magnetic permeability.

Although spherical ferrite filler particles are described in the foregoing example, the magnetic particles disclosed herein are not limited to spherical ferrite filler particles. Rather, various kinds and shapes of magnetic particles may be used.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A common mode filter, comprising:

an insulator;

a coil pattern embedded within the insulator; and a magnetic layer comprising a layer of material filled with magnetic particles and adhered to the insulator, wherein different-size magnetic particles among the magnetic particles are disposed in a region of a first surface of the magnetic layer adhered to the insulator, and only similar-size particles among the magnetic particles are disposed in a region of a second surface of the magnetic layer opposite the first surface.

2. The common mode filter of claim 1, wherein:

the layer of material comprises a sheet made of a resin material; and the magnetic particles comprise spherical ferrite particles.

3. The common mode filter of claim 2, wherein an amount of the spherical ferrite particles in the magnetic layer is 93 wt %.

4. The common mode filter of claim 1, wherein the magnetic layer comprises magnetic layers laminated on a top surface of the insulator and a bottom surface of the insulator.

5. The common mode filter of claim 1, further comprising a passivation layer disposed between the magnetic layer and the insulator.

6. The common mode filter of claim 1, further comprising electrodes formed on lateral surfaces of the insulator and the magnetic layer, and connected to the coil pattern.

7. The common mode filter of claim 1, wherein the magnetic layer is laminated on the insulator.

8. A common mode filter, comprising:

an insulating layer;

a coil pattern disposed in the insulating layer; and a magnetic layer adhered to the insulating layer and comprising magnetic particles disposed in a resin, wherein particles of different sizes, among the magnetic particles, are disposed in a region of a first surface of the magnetic layer contacting the insulating layer, and wherein only particles of a similar size, among the magnetic particles, are disposed in a region of a second surface of the magnetic layer opposite the first surface.

9. The common mode filter of claim 8, wherein the magnetic particles comprise spherical ferrite particles in an amount of 93 wt % of the magnetic layer.

* * * * *